US010176965B1

(12) United States Patent
Breuer (10) Patent No.: US 10,176,965 B1
(45) Date of Patent: Jan. 8, 2019

(54) ABERRATION-CORRECTED MULTIBEAM SOURCE, CHARGED PARTICLE BEAM DEVICE AND METHOD OF IMAGING OR ILLUMINATING A SPECIMEN WITH AN ARRAY OF PRIMARY CHARGED PARTICLE BEAMLETS

(71) Applicant: ICT Integrated Circuit Testing Gesellschaft für Halbleiterprüftechnik mbH, Heimstetten (DE)

(72) Inventor: John Breuer, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/642,147

(22) Filed: Jul. 5, 2017

(51) Int. Cl.
*H01J 37/10* (2006.01)

(52) U.S. Cl.
CPC ....... *H01J 37/10* (2013.01); *H01J 2237/1534* (2013.01)

(58) Field of Classification Search
CPC .......................... H01J 37/153; H01J 2237/153
See application file for complete search history.

(56) References Cited

U.S. PATENT DOCUMENTS

| 2011/0065753 A1* | 3/2011 | Ramstedt et al. .. H01J 37/1472 250/397 |
| 2011/0147605 A1* | 6/2011 | Janzen ............... B82Y 10/00 250/396 R |
| 2014/0175300 A1* | 6/2014 | Koning et al. ......... H01J 37/12 250/396 R |

* cited by examiner

*Primary Examiner* — Eliza Osenbaugh-Stewart

(74) *Attorney, Agent, or Firm* — Kilpatrick Townsend & Stockton LLP (57) ABSTRACT

A charged particle beam device for inspection of a specimen with an array of primary charged particle beamlets is described. The charged particle beam device includes a charged particle beam source to generate a primary charged particle beam; a multi-aperture plate having at least two openings to generate an array of charged particle beamlets having at least a first beamlet having a first resolution on the specimen and a second beamlet having a second resolution on the specimen; an aberration correction element to correct at least one of spherical aberrations and chromatic aberrations of rotational symmetric charged particle lenses; and an objective lens assembly for focusing each primary charged particle beamlet of the array of primary charged particle beamlets onto a separate location on the specimen.

20 Claims, 7 Drawing Sheets

ABERRATION-CORRECTED MULTIBEAM SOURCE, CHARGED PARTICLE BEAM DEVICE AND METHOD OF IMAGING OR ILLUMINATING A SPECIMEN WITH AN ARRAY OF PRIMARY CHARGED PARTICLE BEAMLETS

TECHNICAL FIELD

Embodiments relate to charged particle beam devices, for example, for inspection system applications, testing system applications, defect review or critical dimensioning applications or the like. Embodiments also relate to methods of operation of a charged particle beam device. More particularly, embodiments relate to charged particle beam devices being multi-beam systems for general purposes (such as imaging biological structures) and/or for high throughput EBI (electron beam inspection). Specifically, embodiments relate to a scanning charged particle beam device and a method of electron beam inspection with a scanning charged particle beam device.

BACKGROUND

Modern semiconductor technology is highly dependent on an accurate control of the various processes used during the production of integrated circuits. Accordingly, the wafers are inspected repeatedly in order to localize problems as early as possible. Furthermore, a mask or reticle is also inspected before the actual use during wafer processing in order to make sure that the mask accurately defines the respective pattern. The inspection of wafers or masks for defects includes the examination of the whole wafer or mask area. Especially, the inspection of wafers during the fabrication includes the examination of the whole wafer area in such a short time that production throughput is not limited by the inspection process.

Scanning electron microscopes (SEM) have been used to inspect wafers. The surface of the wafer is scanned using, e.g., a single finely focused electron beam. When the electron beam hits the wafer, secondary electrons and/or backscattered electrons, i.e. signal electrons, are generated and measured. A pattern defect at a location on the wafer is detected by comparing an intensity signal of the secondary electrons to, for example, a reference signal corresponding to the same location on the pattern. However, because of the increasing demands for higher resolutions, scanning the entire surface of the wafer takes a long time. Accordingly, using a conventional (single-beam) scanning electron microscope (SEM) for wafer inspection is difficult, since the approach does not provide the respective throughput.

Wafer and mask defect inspection in semiconductor technology needs high resolution and fast inspection tools, which cover both full wafer/mask application or hot spot inspection. Electron beam inspection gains increasing importance because of the limited resolution of light optical tools, which are not able to handle the shrinking defect sizes. In particular, from the 20 nm node and beyond, the high-resolution potential of electron beam based imaging tools is in demand for detecting all defects of interest.

Current multi-particle-beam systems may include an aperture lens array. The focal length of an aperture lens is inversely proportional to the difference of the electric field component (along the average axis) before and after the aperture. By shaping the field distribution along an aperture lens array, the focal length of the individual apertures can be varied in such a way that the field curvature of the beamlets can be controlled (or corrected). In such a configuration, other off-axial aberrations (field astigmatism, off-axial coma, and distortion) remain. To mitigate these remaining aberrations, the intermediate beamlet foci are often strongly magnified images of the source. The images of the source are strongly demagnified with the downstream objective lens. This tradeoff between the demagnification and remaining off-axial aberrations limits the performance of such devices. Another way, which is often employed, is to limit the total emission angle from the source (i.e., the number of total beamlets), so that the off-axial aberrations can be reduced.

In view of the above, a charged particle beam device and a method of imaging a specimen with an array of primary charged particle beamlets is provided that overcome at least some of the problems in the art.

SUMMARY

In light of the above, a charged particle beam device for inspection of a specimen with an array of primary charged particle beamlets and a method of imaging or illuminating a specimen with an array of primary charged particle beamlets are provided.

According to one embodiment, a charged particle beam device for inspection of a specimen with an array of primary charged particle beamlets is provided. The charged particle beam device includes a charged particle beam source to generate a primary charged particle beam; a multi-aperture plate having at least two openings to generate an array of charged particle beamlets having at least a first beamlet having a first resolution on the specimen and a second beamlet having a second resolution on the specimen; an aberration correction element to correct at least one of spherical aberrations and chromatic aberrations of rotational symmetric charged particle lenses; and an objective lens assembly for focusing each primary charged particle beamlet of the array of primary charged particle beamlets onto a separate location on the specimen.

According to one embodiment, a charged particle beam device for inspection of a specimen with an array of primary charged particle beamlets is provided. The charged particle beam device includes a charged particle beam source to generate a primary charged particle beam; a multi-aperture plate having at least two openings to generate an array of charged particle beamlets having at least a first beamlet having a first resolution on the specimen and a second beamlet having a second resolution on the specimen; an aberration correction element provided between the charged particle beam source and the multi-aperture plate to correct a difference of the first resolution on the specimen as compared to the second resolution on the specimen, comprising at least two multipole elements with 6 or more poles; and an objective lens assembly for focusing each primary charged particle beamlet of the array of primary charged particle beamlets onto a separate location on the specimen.

According to another embodiments, a method of imaging or illuminating a specimen with an array of primary charged particle beamlets is provided. The method includes generating an array of charged particle beamlets having at least a first beamlet and a second beamlet by illuminating a multi-aperture plate with a primary charged particle beam; focusing the array of charged particle beamlets on the specimen with an objective lens assembly; and correcting aberration differences between the first beamlet and the second beamlet with an aberration correction element.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, the same reference numbers refer to same components. The differences with respect to individual embodiments are described. Each example is provided by way of explanation and is not meant as a limitation. Further, features illustrated or described as part of one embodiment can be used on or in conjunction with other embodiments to yield yet a further embodiment. The description is intended to include the modifications and variations.

Without limiting the scope of protection of the present application, in the following the charged particle beam device or components thereof will exemplarily be referred to as a charged particle beam device including the detection of secondary or backscattered particles, such as electrons. Embodiments can still be applied for apparatuses and components detecting corpuscles, such as secondary and/or backscattered charged particles in the form of electrons or ions, photons, X-rays or other signals in order to obtain a specimen image. When referring to corpuscles, the corpuscles are to be understood as light signals in which the corpuscles are photons as well as particles, in which the corpuscles are ions, atoms, electrons or other particles. As described herein, discussions and descriptions relating to the primary charged particle beam and primary charged particle beamlets are exemplarily described with respect to electrons in scanning electron microscopes. Other types of charged particles, e.g. positive ions, could be utilized as a primary charged particle beam or primary charged particle beamlets.

According to embodiments herein, which can be combined with other embodiments, a signal (charged particle) beam, or a signal (charged particle) beamlet is referred to as a beam of secondary particles, i.e. secondary and/or backscattered particles. Typically, the signal beam or secondary beam is generated by the impingement of the primary beam or primary beamlet on a specimen or by backscattering of the primary beam from the specimen. A primary charged particle beam or a primary charged particle beamlet is generated by a particle beam source and is guided and deflected on a specimen to be inspected or imaged.

A "specimen" or "sample" as referred to herein, includes, but is not limited to, semiconductor wafers, semiconductor workpieces, photolithographic masks and other workpieces such as memory disks and the like. Embodiments may be applied to any workpiece on which material is deposited or which is structured. A specimen includes a surface to be structured or on which layers are deposited, an edge, and typically a bevel. According to some embodiments, which can be combined with other embodiments described herein, the apparatus and methods are configured for or are applied for electron beam inspection, for critical dimensioning applications and defect review applications.

Figure 1:
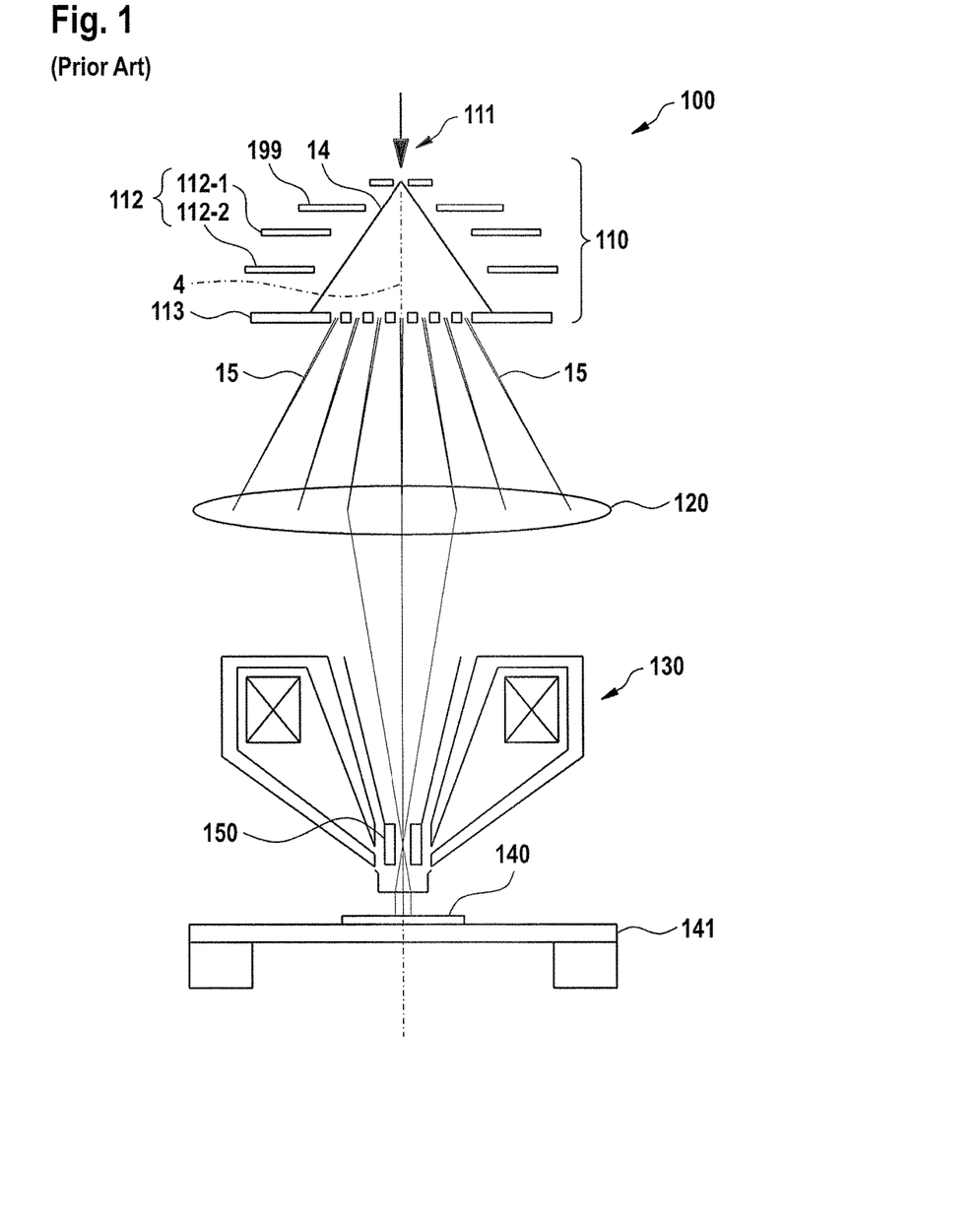
FIG. 1 shows a schematic view of a multi-beam device for specimen inspection.

A charged particle beam device 100 is shown schematically in FIG. 1. The charged particle beam device 100 includes a charged particle beam source 110 including a particle beam emitter 111, which emits a primary charged particle beam 14. According to embodiments described herein, the charged particle beam source 110 is adapted for generating an array of primary charged particle beamlets 15. The charged particle beam source 110 may include the charged particle beam emitter 111, and a multi-aperture plate 113 having at least two openings. The primary charged particle beam 14 may be accelerated by an accelerating voltage supplied to the acceleration electrode 199. The charged particle beam device may include electrodes 112-1 and 112-2.

The electrodes 112 of the charged particle beam device can be adapted and driven to generate an electrical field on the surface of the multi-aperture lens plate. The surface of the multi-aperture plate 113 may be a surface of the multi-aperture plate facing the electrode 112-2.

The charged particle beam source 110 including the beam emitter, the multi-aperture plate and the electrodes 112 may be denoted as an upper part of the charged particle beam device. The charged particle beam device 100 exemplarily further includes a lens 120, an objective lens 130, and a specimen stage 141, on which a specimen 140 may be placed. The lens 120, the objective lens 130, and the specimen stage 141 may be described as being part of the lower part of the charged particle beam device. A demagnification of the emitter tip of the charged particle device is given by the source position and the focal length of the objective lens array.

An electric field having a z-component is generated by a voltage difference between the electrode 112-2 and the multi-aperture plate 113. The electrical field may have a z-component extending in the z-direction of the charged particle beam device, i.e. along the optical axis 4. The component of the electrical field in the z-direction provided by the electrodes 112 may vary over the plane of the surface of the multi-aperture lens plate.

A, for example, rotational symmetric, z-component of the electrical field on the surface of the multi-aperture plate can be utilized for a field curvature (or image field curvature) correction by the electrodes. Further, for instance, a non-rotationally symmetric configuration of the z-component of the electrical field may be realized by a segmented arrangement of at least one of the electrodes 112, in order to correct for image field tilt.

The varying field of the first electrode on the surface of the multi-aperture plate in the charged particle beam device can be used for correcting the field curvature of the charged particle beam device, in particular the field curvature introduced by the imaging lenses of the charged particle beam device. More than one electrode may be used for compensating or correcting the field curvature.

Segmented electrodes may be used to create a non-rotationally symmetric field configuration on the surface of the multi-aperture, which can be used to correct image field tilt that may originate from non-rotationally symmetric optical elements or from a tilted specimen.

The charged particle beam device may include electrodes 112-1 and 112-2 (two electrodes are exemplarily shown). According to some embodiments, the first electrode may be used to provide the electrical field to create the aperture lenses and the second electrode may be used as the field curvature correction electrode. Further, the charged particle beam device 100 may include a scanning deflector 150. The scanning deflector 150 can be provided between the lens 120 and the specimen stage 141. Particularly, the scanning deflector can be surrounded by a pole piece assembly of the objective lens 130 and/or at a position of an electrode of an electrostatic lens.

The field on the multi-aperture plate can be varied in such a way that the image field curvature or image field tilt of the beamlets can be controlled (or corrected). Yet, other off-axial aberrations (e.g. field astigmatism, off-axial coma, and distortion) remain.

According to embodiments described herein, inspection of the specimen with an array of primary charged particle beamlets is provided. A multi-aperture plate is provided to generate the array of primary charged particle beamlets from a primary charged particle beam. The multi-aperture plate may have two or more openings. The multi-aperture plate can divide a large bundle of the primary charged particle beam into individual beamlets, i.e. the array of primary charged particle beamlets. An aberration correction element is provided, particularly to correct differences in aberrations between different beamlets of the array of primary charged particle beamlets. According to some embodiments, which can be combined with other embodiments described herein, the aberration correction element can correct either Cs, i.e. spherical aberrations, or both Cc and Cs, i.e. chromatic aberrations and spherical aberrations.

Figure 2:
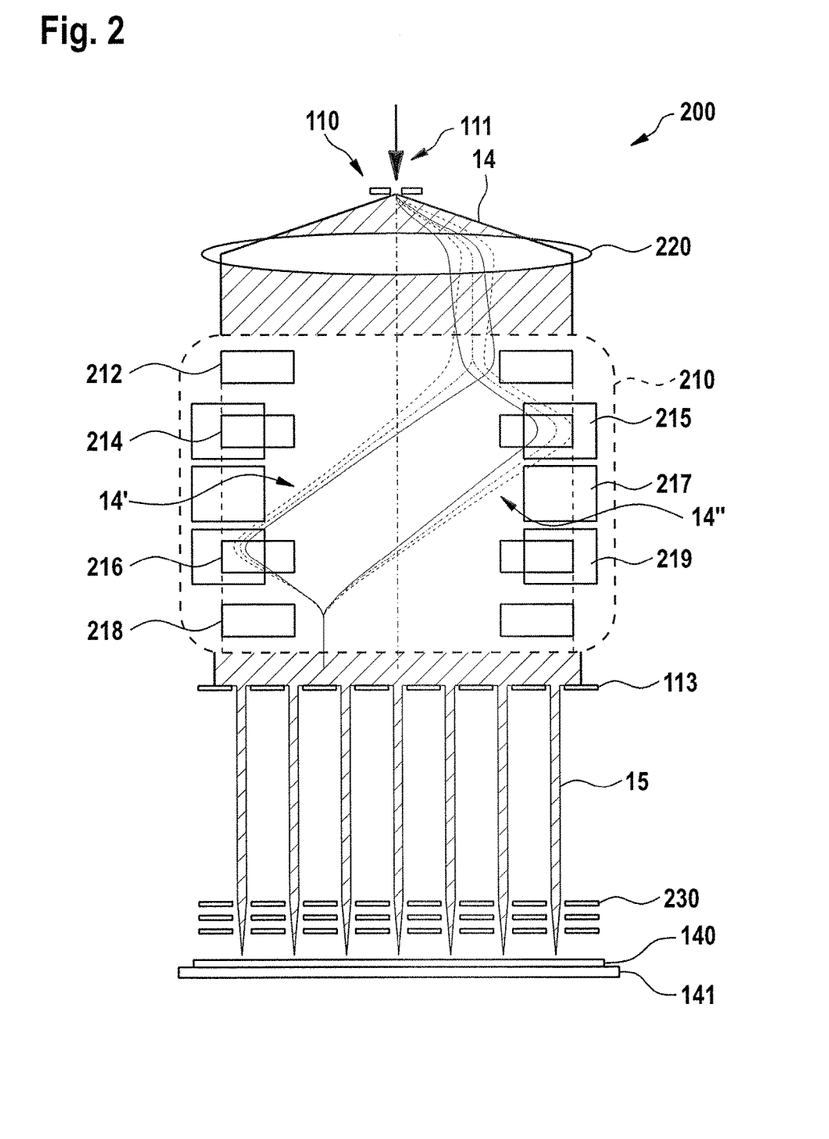
FIG. 2 shows a schematic view of a multi-beam device for specimen inspection according to embodiments described herein and having an objective lens array.

FIG. 2 shows a charged particle beam device 200, e.g. for inspection of the specimen with an array of primary charged particle beamlets. The charged particle beam source 110 includes a particle beam emitter 111, which emits a primary charged particle beam 14.

A collimator device such as a condenser lens assembly 220 can be provided in the charged particle beam device, for example a multi-particle-beam system. The charged particle beam device may be used for particle beam inspection or particle beam lithography applications. According to some embodiments, which can be combined with other embodiments described herein, the condenser lens assembly can include one or more round lenses, for example, an electrostatic lens, a magnetostatic lens, or a combined magnetic electrostatic lens acting on the primary charged particle beam emitted by the charged particle beam source 110. Collimation devices such as the condenser lens assembly 220 may include one or more electrostatic or magnetostatic lenses, which are used to create a parallel (or nearly parallel) particle beam with a beam divergence of less than a few mrad.

Due to the spherical and chromatic aberrations, Cs and Cc of such a collimation device, large angle trajectories and trajectories of particles with slightly different than nominal energy are not parallel to the axis of the system, even if the paraxial trajectories with nominal energy are. This is caused by the second, third, and higher order path deviations which cannot be avoided for conventional round lens systems according to the Scherzer theorem.

The second and third order path deviations, i.e. second and third order aberrations, of a round lens system have chromatic and spherical aberrations increasing inter alia with the half angle $\Omega$ of the central trajectory of an individual beamlet as well as the angle $\omega$ of off-axial trajectories within one beamlet. These aberrations may increase linearly or quadratically with the half angle $\Omega$ and the angle $\omega$. Further, chromatic aberrations may increase with the chromaticity parameter k related to the energy width of the source. Resulting aberrations correspond to radial chromatic distortion and chromatic aberration, radial geometric distortion, radial field astigmatism, field curvature, radial off-axial coma, and spherical aberration. All of those above mentioned aberrations (except for the chromatic and spherical aberration) depend on the beamlet angle $\Omega$ and hence lead to a non-uniformity from beamlet to beamlet and therefore cause a non-uniform resolution on the specimen.

According to embodiments described herein, an aberration correction element 210 is provided. The aberration correction element is used to correct the spherical and/or chromatic aberration coefficients, Cs and Cc, of the collimator lens, and optionally in addition of the objective lens. The above referenced second and third order aberrations of the primary charged particle beam may be considered as the cause of the field curvature aberration between the primary charged particle beamlets. Thus, the field curvature of a beamlet array may be corrected by controlling the corresponding chromatic and spherical aberrations of the primary charged particle beam, i.e. the assembly of the beamlets. For example, the aberration correction element may generate electro-magnetic quadrupole fields. FIG. 2 shows a first magnetic quadrupole 212, the first electromagnetic quadrupole 214, a second electromagnetic quadrupole 216, and a second magnetic quadrupole 218. The resulting corrections are shown by beam paths 14' in a Y-Z-plane and beam paths 14" in an X-Z-plane. As can be seen, beam trajectories with different energies (see different lines) exit the aberration correction element 210 parallel or essentially parallel to the optical axis, thereby correcting the chromatic aberration. Additionally, superposed octupole fields may be used to correct for spherical aberrations. Corresponding octupoles are for example shown in FIG. 2. A first octupole 215 can be superposed with the first electromagnetic quadrupole 214. A third octupole 219 can be superposed with the first electromagnetic quadrupole 216. A second octupole 217 can be provided between the first octupole and the third octupole, e.g. in the middle of the two octupoles. According to some embodiments, which can be combined with other embodiments described herein, it is beneficial if the aberration correction element 210 is symmetric, i.e. the quadrupoles and the octupoles are symmetric to a symmetry plane orthogonal to the optical axis.

According to yet, further embodiments, the above described aberration correction element 210 can be modified by having four or more octupoles. For example, four octupoles can be superposed with respective ones of the quadrupoles denoted with reference numerals 212, 214, 216, and 218.

According to yet further embodiments, further modifications of an aberration correction element 210 can include the quadrupoles 212 and 218 may also be electrostatic or combined magnetic electrostatic.

According to some embodiments, which can be combined with other embodiments described herein, an aberration correction element 210 can correct or compensate Cc, Cs, or both Cc and Cs.

According to yet further embodiments, in the case that the energy width of the source is sufficiently small enough, a simpler Cs corrector (e.g., hexapole fields and transfer doublet) may be used, as long as the chromatic effects can be neglected. Accordingly, an aberration correction element 210 may alternatively include a first electric or magnetic hexapole and a second electric or magnetic hexapole. A transfer lens system consisting of at least one lens can be provided to provide a symmetric ray path through the field arrangements. The symmetrical arrangement allows for correcting the spherical aberration while preventing the introduction of second order geometric aberrations, e.g. the threefold astigmatism. By utilizing an aberration correction element according to embodiments described herein, the parallelism of the individual beamlets may be limited only due to path deviations of a fourth or higher order as well as imperfections of the aberration correction element.

According to embodiments described herein, the aberration correction element can be a non-rotationally symmetric multipole corrector. For example, a quadrupole-octupole corrector for simultaneous correction of Cs and Cc or a double hexapole corrector for Cs correction can be provided. Embodiments include at least two multipole elements with 6 or more poles, e.g. hexapole elements, octupole elements, or even higher order multipole elements. According to yet further embodiments, which can be combined with other embodiments described herein, the aberration correction element is configured to operate at fixed excitation at all times and/or for various operation modes.

According to yet further embodiments, which can be combined with other embodiments described herein, the aberration correction element can be configured to correct at least one of spherical aberrations and chromatic aberrations of rotationally symmetric charged particle lenses. For example, the aberration correction element is configured to correct the difference between the first resolution on the specimen and the second resolution on the specimen and comprises at least two multipole elements with each consisting of 6 or more poles. According to yet further examples or modifications, which can be combined with other embodiments described herein, the aberration correction element can be selected from the group consisting of: a foil lens, a membrane corrector, wherein the primary electrons trespass a membrane of varying thickness, a space charge lens, a high frequency lens, and a mirror corrector.

Due to the increasing demand for high throughput particle beam inspection devices, charged particle beam devices with an array of primary charged particle beamlets, i.e. multi-beam systems, have been suggested. At least two beams are scanned across the specimen within the same column or device. A charged particle beam device may include a scanning deflector 150 as described with respect to FIG. 1. The array of primary charged particle beamlets is provided by creating a comparatively large collimated particle beam which is then divided into multiple parallel beamlets by a multi-aperture array 113 as, e.g., shown in FIG. 2. The primary charged particle beamlets 15 are focused on the specimen 140 by an objective lens assembly 230. As shown in FIG. 2, the objective lens assembly can be an objective lens array. The objective lens array can include multiple individual lenses used to focus the beamlets onto the specimen, e.g. onto a separate location on the specimen. The specimen can be supported on a specimen stage 141.

The radial geometric and chromatic distortion (outer beamlets are not parallel to the central beamlets), radial field astigmatism (outer beamlets are astigmatic), field curvature (outer beamlets are more or less converging or diverging within themselves compared with inner beamlets), and radial off-axial coma (outer beamlets exhibit coma aberration) may result in a varying resolution on the specimen depending on the off-axial distance of the beamlet. Accordingly, embodiments described herein provide an aberration correction element 210 to correct for a varying resolution of the beamlets. The beamlets may have vanishing Cc and Cs before entering the objective lens assembly. Using such a device is capable of producing beamlets which are (up to the third order) parallel with respect to each other and within themselves. A multi-beam system according to embodiments described herein may, thus, improve the resolution uniformity on the specimen.

Figure 3:
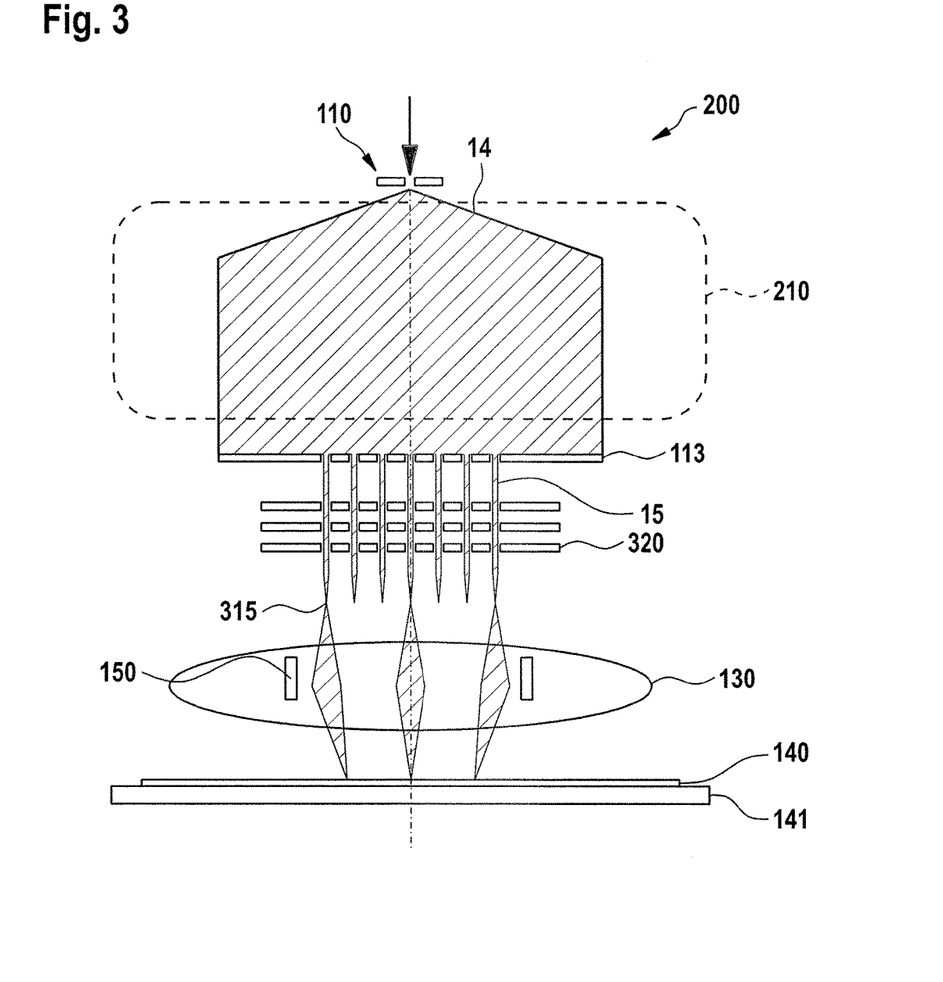
FIG. 3 shows a schematic view of a multi-beam device for specimen inspection according to embodiments described herein and having a lens array and a common objective lens.

FIG. 3 shows another embodiment of a charged particle beam device 200 having an array of primary charged particle beamlets. A primary charged particle beam is generated by the charged particle beam source 110. An aberration correction element 210 is provided, wherein aspects, details, and optional modifications can be used as described with respect to FIG. 2. A comparably wide primary charged particle beam, which can for example be parallel, illuminates the multi-aperture plate 113. An array of primary charged particle beamlets 15 is generated. A lens array 320 creates individual crossovers 315. For example, the lens array creating the intermediate crossovers may, e.g., include Einzel lenses or aperture lenses. A common objective lens 130 focuses the beamlets on different or separate locations on the specimen 140.

In FIG. 3, the objective lens 130 is schematically illustrated. An objective lens 130 can be provided for embodiments described herein as shown in more detail in FIG. 1. The objective lens may include a coil and upper and lower pole pieces, wherein a magnetic lens component for the array of primary charged particle beamlets is provided. Further, an upper electrode and a lower electrode may provide an electrostatic lens component of the objective lens 130. A demagnification of the emitter tip of the charged particle device is given by the source position and the focal length of the objective lens array.

According to some optional modifications yielding yet further embodiments, a possibly existing fifth order spherical aberration coefficient C5 can be adjusted by an appropriate distance between the condenser lens array and the aberration correction element.

Particularly, the objective lens can be a combined magnetic electrostatic lens. The electrostatic lens component can, according to some embodiments, provide a deceleration lens, wherein the landing energy of the beamlets on the specimen can be reduced as compared to the energy of the beamlets within the column. For example, the landing energy can be between about 100 eV and 8 keV, more typically 2 keV or less, e.g. 1 keV or less, such as 500 eV or even 100 eV. The beam energy of the beamlets within the column can be 5 keV or above, such as 20 keV or above, or even 50 keV or above.

In some embodiments, which may be combined with other embodiments described herein, the objective lens 130 may be a field compound lens. For instance, the objective lens may be a combination of a magnetic lens component and an electrostatic lens component. Accordingly, the objective lens may be a compound magnetic-electrostatic lens. Typically, the electrostatic part of the compound magnetic-electrostatic lens is an electrostatic retarding field lens.

Using a compound magnetic-electrostatic lens yields superior resolution at low landing energies, such as a few hundred electron volts in the case of a scanning electron microscope (SEM). Low landing energies are beneficial, especially in the modern semiconductor industry, to avoid the charging and/or the damage of radiation sensitive specimens.

Further, the charged particle beam device 200 may include a scanning deflector 150. The scanning deflector 150 can be provided between the lens and the specimen stage 141. Particularly, the scanning deflector can be surrounded by a pole piece assembly of the objective lens 130 and/or at a position of an electrode of the electrostatic lens component.

According to some embodiments, which can be combined with other embodiments described herein, it is also possible to operate the correction element, i.e. the Cc-Cs corrector having two or more multipole elements, as a lens. The aberration correction element can focus the primary charged particle beam to reduce a divergence between a first beamlet and a second beamlet, for example to generate parallel beamlets. Accordingly, a condenser lens or a condenser lens assembly collimating the primary charged particle beam before impingement on the multi-aperture plate can be optional for some configurations.

Further, for embodiments utilizing a common objective lens (see e.g. FIGS. 3 and 4), the aberration correction element, i.e. the Cc-Cs corrector can be operated to not fully correct the aberrations of the lens array and an optionally existing condenser lens assembly. The aberration correction element 210 in combination with the lens array 320 can provide an array of intermediate beamlet crossovers which possess the opposite off-axial aberrations (field curvature, field astigmatism, radial chromatic distortion, etc.) as the common objective lens. For embodiments having a common objective lens and a condenser lens assembly, the aberration correction element may be operated to not fully correct the aberrations of the condenser lens. The operation may be to create an array of intermediate beamlet crossovers which possess the opposite off-axial aberrations (field curvature, field astigmatism, radial chromatic distortion, etc.) as the common objective lens. Thus, according to some embodiments, the Cc-Cs corrector within the collimator can be used to create defined field curvature, field astigmatism, and radial chromatic distortion, which cancel the inherent off-axial aberrations of the common objective lens.

In FIG. 3 the beamlets pass the objective lens without going through a common crossover. The Cc-Cs corrector within the collimator can be adjusted in such a way that the off-axial coma of the objective lens is corrected. Because of the avoiding of a common crossover, Coulomb or electron-electron interactions, that can lead to a deterioration of the resolution on the specimen, can be reduced.

Further, the charged particle beam device 200 may include a scanning deflector 150. The scanning deflector 150 can be provided within the objective lens or between the lens and the specimen stage 141. Particularly, the scanning deflector can be surrounded by a pole piece assembly of the objective lens and/or at a position of an electrode of the electrostatic lens component.

Figure 4:
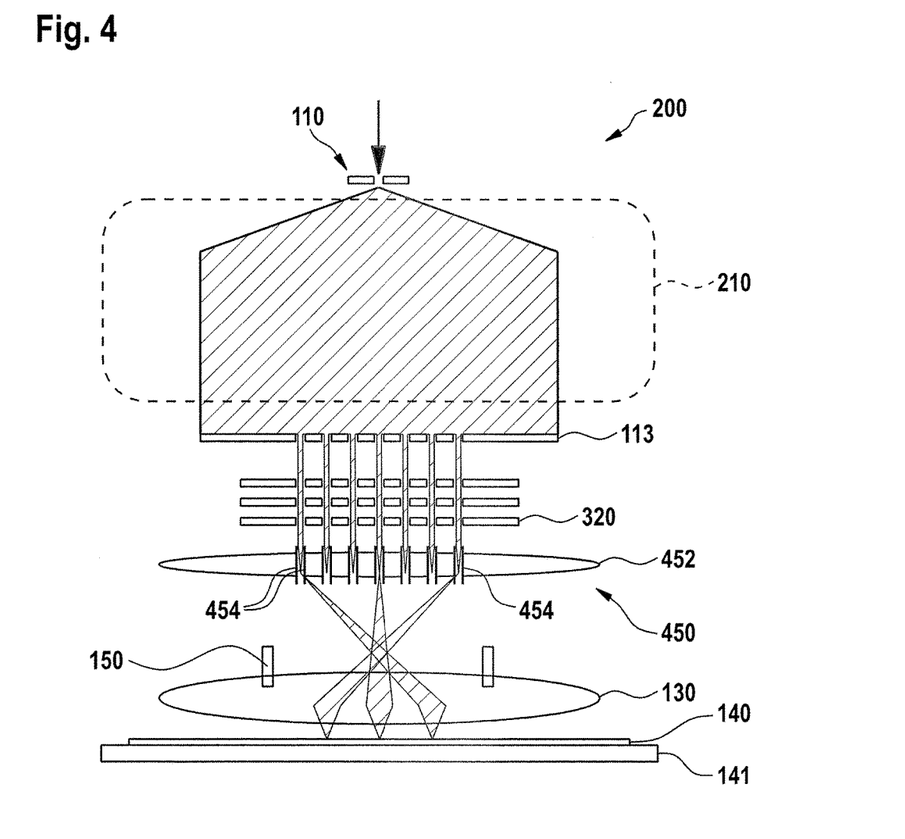
FIG. 4 shows a schematic view of a multi-beam device for specimen inspection according to embodiments described herein and having a lens array, a deflector array, and a common objective lens.

FIG. 4 shows another embodiment of a charged particle beam device 200. An additional deflection element 450 having deflectors 454 and, optionally also a further lens 452 close to the intermediate crossover plane may be used to adjust an off-axial coma of the beamlets. The beamlets may be deflected on a "coma-free" path. Alternatively, the deflection element 450 guiding the beamlets through a coma-free point of the objective lens can include the further lens 452, whereas the deflector array having the deflectors 454 can be optional. Accordingly, the deflection element 450 can include the further lens 452, the deflector arrays having the deflectors 454, or both.

According to some embodiments, a deflector array may be arranged within or near the further lens. According to some embodiments, the deflector array being arranged "in or near" or "within" the further lens may be understood in that the deflector array is placed within the focal length of the further lens. For instance, the further lens may include three electrodes and the deflector array may be placed within the three electrodes. According to some embodiments, the deflector array may approximately be placed at the height of the middle electrode of the three electrodes of the further lens.

According to some embodiments, the further lens may be used for achieving the main effect of directing the primary charged particle beamlets, for instance for directing the primary charged particle beamlets to the coma free point of the objective lens. A deflector array may be used in some embodiments for fine adjustment of the individual primary charged particle beamlets, especially the fine adjustment of the primary charged particle beamlets to be guided into or through the coma free point of the objective lens.

As used throughout the present disclosure, the term "coma-free plane" or "coma-free point" refers to a plane or a point of (or provided by) the objective lens at which minimum or even no coma is introduced in the primary charged particle beamlets when the primary charged particle beamlets pass through the coma-free point or coma-free plane. The coma-free point or coma-free plane of the objective lens is a point or plane of the objective lens at which the Fraunhofer condition (the condition that the coma is zero) is satisfied. The coma-free point or coma-free plane of the objective lens is located on a z-axis of the optical system of the charged particle beam device, wherein the z-axis extends along the optical axis 4 (see FIG. 1) of the objective lens. The coma-free point or coma-free plane can be positioned within the objective lens. For example, the coma-free point or coma-free plane can be surrounded by the objective lens.

According to embodiments described herein, the charged particle beam device and the method for inspecting a specimen with an array of primary charged particle beamlets described herein allow for correcting off-axis aberrations for compensating differences in resolution between different beamlets of the array of primary charged particle beamlets. Embodiments described herein thus allow for a system, wherein off-axial aberrations would only or mainly result from 4th or higher order aberrations of, e.g., the condenser-corrector system.

Embodiments of charged particle beam devices 200, as exemplarily shown in FIGS. 2, 3, 4, and 6, may include the further optional modification to yield yet further embodiments. A charged particle beam emitter 111 of the charged particle beam source 110 may be a cold field emitter (CFE), a Schottky emitter, a TFE or another high current high brightness charged particle beam source (such as an electron beam source). A high current is considered to be 5 µA in 100 mrad or above, for example up to 5 mA, e.g. 30 µA in 100 mrad to 1 mA in 100 mrad, such as about 300 µA in 100 mrad. According to some implementations, the current is distributed essentially uniform, e.g. with a deviation of +−10%, particularly in the case of a linear or rectangular array.

According to yet further embodiments, which can be combined with other embodiments described herein, a TFE or another high reduced-brightness source, e.g. an electron-beam source, capable of providing a large beam current is a source where the brightness does not fall by more than 20% of the maximum value when the emission angle is increased to provide a maximum of 10 μA-100 μA, for example 30 μA. According to some embodiments, which may be combined with other embodiments described herein, the objective lens array may include individual electrostatic lenses (in particular retarding field lenses). In some embodiments, an objective lens array may be used in embodiments described herein including individual magnetic lens pieces, in particular having a common excitation coil. According to some embodiments, an objective lens array used for a charged particle beam device according to embodiments described herein may include a combination of individual electrostatic lenses and individual magnetic lenses. Alternatively, a common objective lens can be used as described with respect to FIGS. 3 and 4.

In the embodiments described with regard to FIGS. 2, 3, 4 and 6, the primary charged particle beam 14 can pass through the multi-aperture plate 113 after having left the charged particle beam emitter 111, i.e. the emitter tip. The primary charged particle beam 14 passes through the multi-aperture plate 113 having multiple aperture openings. The aperture openings can be situated in any array configuration on the multi-aperture plate 113 such as a line, rectangle, a square, a ring, or any suitable one-dimensional or two-dimensional array. According to embodiments described herein, the charged particle beam device as described herein allows for arraying the aperture openings of the multi-aperture plate in any configuration without having drawbacks due to field curvature or aberrations. For instance, known systems arrange the different beamlets in a ring-like shape for providing the same conditions for every beam passing a lens acting like a parabola. When arranging the beamlets on a ring-like shape, the aberration influence of the respective lens may be minimized. Yet, a ring-shaped arrangement provides limitations for high throughput. With the charged particle beam device according to embodiments described herein, the arrangement of the beamlet array may be done in any arrangement, e.g. an arrangement suitable for fast inspection, an arrangement adapted to the specimen structure to be inspected, an arrangement allowing a large number of beams, an arrangement adapted to the beam intensity and the like. For example, the beamlet array may be arranged in a line, a rectangle, a hexagon, or a square.

In some embodiments, the array of primary charged particle beamlets may be arranged in a one dimensional (line) arrays or 2-dimensional arrays (e.g. 4×4, 3×3, 5×5) or asymmetrical arrays e.g. 2×5. Embodiments described herein are not limited to the examples of arrays and may include any suitable array configuration of primary charged particle beamlets.

By illuminating the multi-aperture plate 113 with the primary charged particle beam 14, several primary charged particle beamlets 15 are created. In the focus plane of the primary charged particle beamlets 15, a lens 120 may be arranged.

In the figures, some of the primary charged particle beamlets of the array of primary charged particle beamlets are shown after the lens, while other primary charged particle beamlets are omitted in the drawings for the sake of a better overview.

Figure 5A:
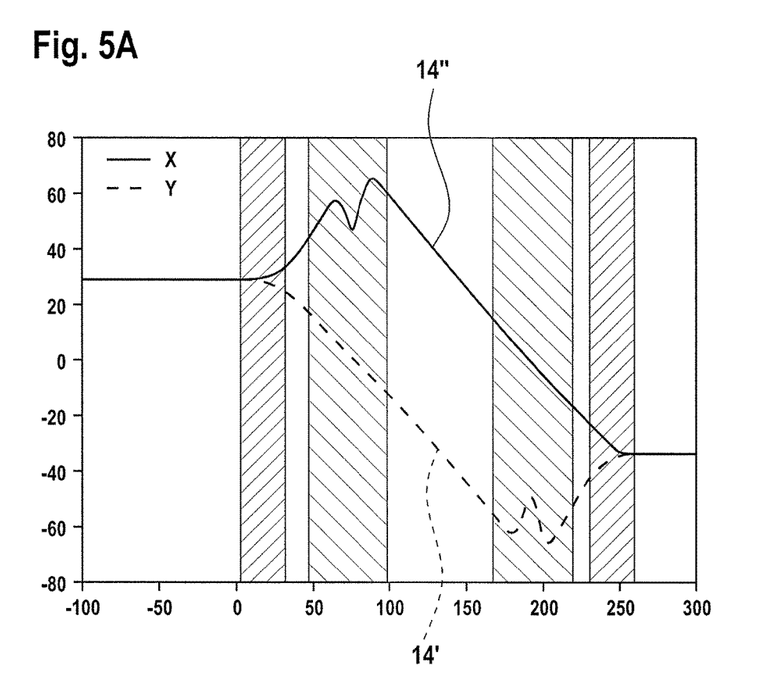
FIG. 5A shows portions of a schematic ray path of a beam in an aberration correction element according to embodiments described herein.

According to some embodiments, which can be combined with other embodiments described herein, the aberration correction element may be an electrostatic corrector, i.e. electrostatic multipoles are included in the aberration correction element. The electrostatic corrector can be, for example, purely electrostatic, i.e. not including magnetic multipoles. This may be beneficial for arraying multiple columns as described with respect to FIG. 6 below. For example, the aberration correction element can include electrostatic lens fields and electrostatic quadrupole fields for chromatic aberration correction. Additionally, electrostatic octupole fields may be superposed for spherical aberration correction. The electrostatic lens fields can be superposed with the quadrupole fields. The resulting corrections are shown by beam paths 14' in a Y-Z-plane and beam paths 14" in an X-Z-plane in FIG. 5A. An electrostatic corrector may be beneficial for allowing reduced space when having an array of two or more columns, wherein each column may provide a multi-beam charged particle device. Further benefits may be that hysteresis is avoided and the field precision is mainly limited by machining tolerances. This is for example described in "Electrostatic correction of the chromatic and of the spherical aberration of charged □ particle lenses" by Christoph Weißbäcker, Harald Rose in J Electron Microsc (Tokyo) (2001) 50 (5): 383-390.

A combined magnetic electrostatic aberration correction element can benefit from decoupling focusing properties and Cc correction, moderate higher order aberrations, moderate sensitivity to alignment errors, and damping of noise in the magnetic circuits to the low kHz range.

Figure 5B:
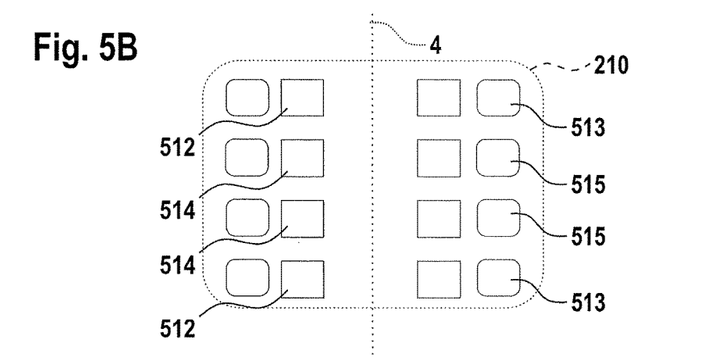
FIG. 5B shows a schematic view of a beam in an aberration correction element according to embodiments described herein.

An exemplary embodiment of an electrostatic aberration correction element 210 is shown in FIG. 5B. The corrector includes a plurality of electrostatic multipoles and lenses, which are, for example, beneficially symmetrically arranged. That is there is a symmetry plane of the aberration correction element, which is orthogonal to the optical axis. For example, elements 512 can be electrostatic quadrupoles, elements 514 can be a combination of electrostatic lenses superposed with electrostatic quadrupoles. Elements 512 and 514 can correct Cc. The elements 513 and 515 can be electrostatic octupoles for correction of Cs. An aberration correction element 210 can include elements to correct Cc, Cs, or both Cc and Cs.

As mentioned above, the charged particle beam device according to embodiments described herein allows for providing an array of primary charged particle beamlets. According to some embodiments, the array of primary charged particle beamlets may typically include three or more primary charged particle beamlets per column, more typically ten or more primary charged particle beamlets. According to some embodiments described herein, the charged particle beam device and the method for inspecting a sample with a charged particle beam device according to embodiments described herein may provide an array of primary charged particle beamlets within one column of a charged particle beam device having a small distance to each other at the sample surface. For instance, the distance between two primary charged particle beamlets within one column may typically be less than 150 μm, more typically less than 100 μm, or even less than 50 μm.

Figure 6:
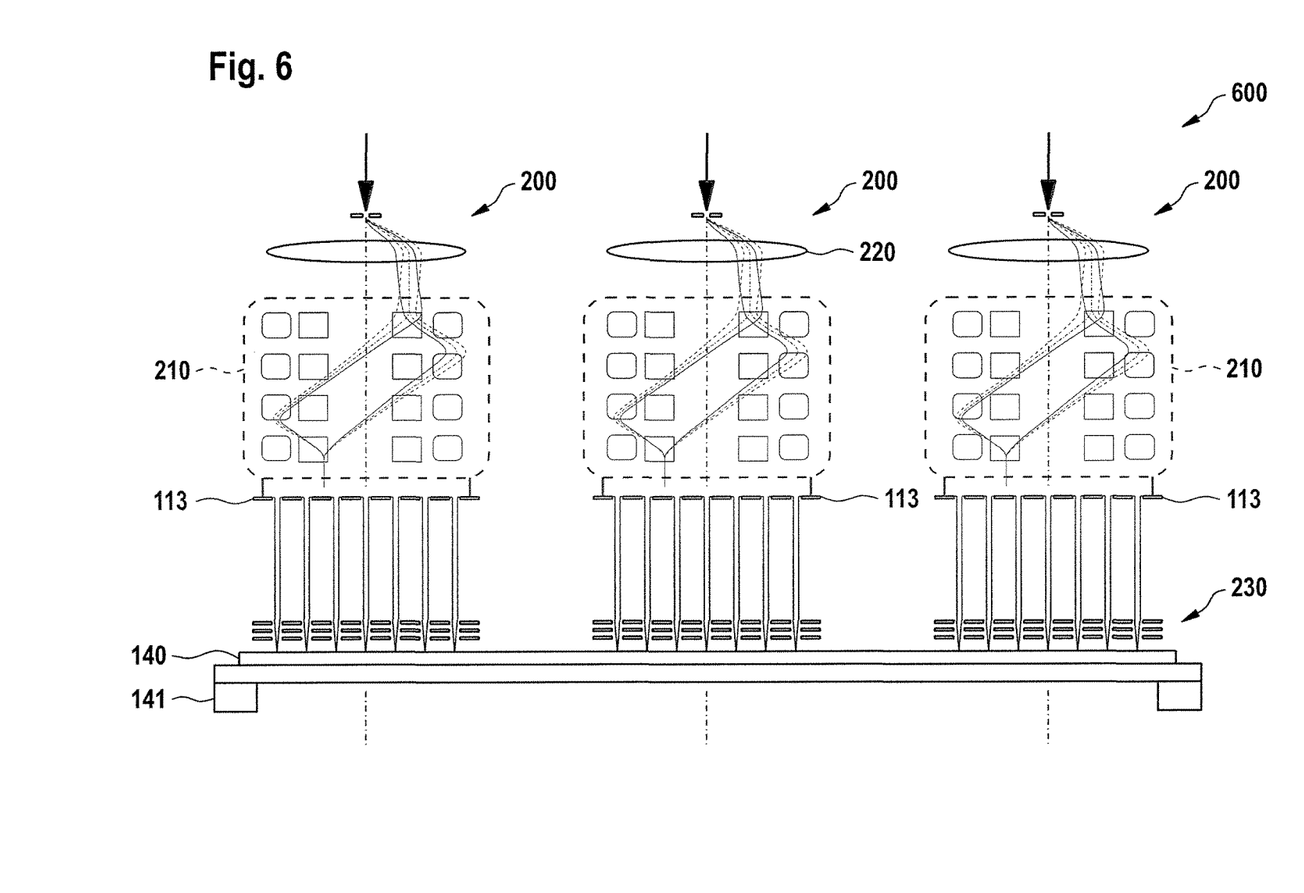
FIG. 6 shows a schematic view of a column array of multi-beam device columns according to embodiments described herein.

In some embodiments, as exemplarily shown in FIG. 6, the charged particle beam device according to embodiments described herein allows to be arrayed in a multi-column microscope (MCM). Multiple columns each having an array of primary charged particle beamlets for inspecting a specimen increases the process speed and throughput.

FIG. 6 shows a multi-column microscope configuration 600. The multi-column microscope configuration 600 is exemplarily shown with three charged particle beam devices 200. The number of charged particle beam devices may deviate from the shown example in multi-column microscope configuration according to embodiments described herein. For instance, a multi-column microscope configuration according to embodiments described herein may have two or more charged particle beam devices, such as two, three, four, five, or even more than five charged particle beam devices. The charged particle beam devices can be arranged in a 1-dimensional or a 2-dimensional array. Each of the charged particle beam devices of the multi-column microscope configuration may be a charged particle beam device having an array of primary charged particle beamlets as described in any of the embodiments described herein.

In the exemplary view of FIG. 6, the multi-column microscope includes charged particle beam devices as shown and described in FIG. 2. The multi-column microscope configuration 600 includes a specimen stage 141 on which a specimen 140 to be inspected is placed. In some embodiments, the charged particle beam devices of the multi-column microscope configuration 600 may inspect one specimen. Alternatively, more than one specimen 140 may be placed on the specimen stage 141.

As shown in FIG. 6, each charged particle beam device 200 includes a condenser lens assembly having, for example, one or more condenser lenses, an aberration correction element 210, the multi-aperture plate 113, and a lens array, e.g. objective lens assembly 230. According to some embodiments described herein, the charged particle beam devices 200 of the multi-column microscope configuration 600 may have a common objective lens assembly.

Additionally a control electrode, e.g. a proxi-electrode, for extracting the signal particles, such as secondary electrons (SE) or backscattered electrons, may be provided for charged particle beam devices of embodiments described herein and/or multi-column microscope configurations 600. The control electrode can be a common electrode for more than one column or can be a control electrode for one column. For instance, with objective lenses as described for embodiments of the present disclosure, the very low landing energy, e.g. 100 eV and a low extraction field, can be provided without deteriorating the overall performance of the charged particle beam imaging system.

According to some embodiments, the charged particle beam devices 200 of the multi-column microscope configuration may have a distance to each other of typically between about 10 mm to about 60 mm, more typically between about 10 mm and about 50 mm. In some embodiments, the distance between the single charged particle beam devices of the multi-column microscope configuration may be measured as the distance between the corresponding optical axes of the charged particle beam devices.

By using several charged particle beam devices in a multi-column microscope configuration as exemplarily shown in FIG. 6, a sufficient number of primary charged particle beamlets can be provided at a sufficient resolution and with a sufficiently small crosstalk between signal beamlets.

Figure 7:
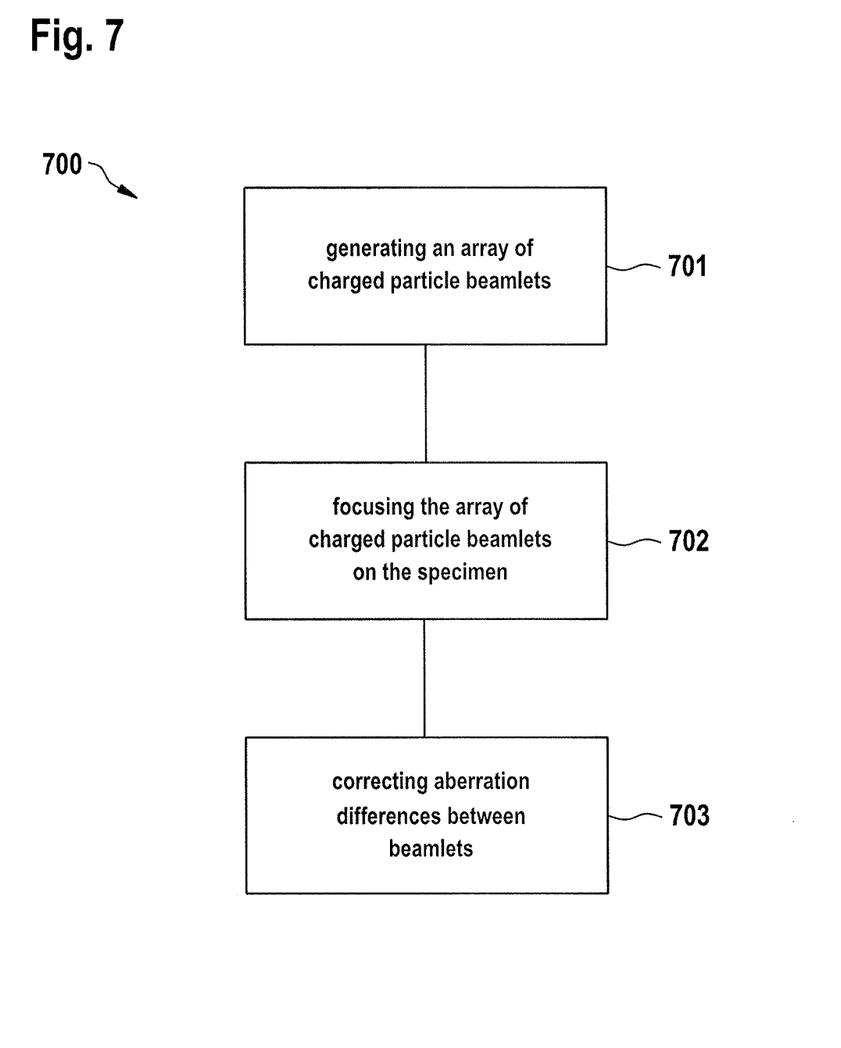
FIG. 7 shows a flow chart of a method for inspecting a specimen with a charged particle beam device according to embodiments described herein.

FIG. 7 shows a flowchart of a method 700 of imaging a specimen with an array of primary charged particle beamlets. In block 701 an array of charged particle beamlets is generated by illuminating a multi-aperture plate with the primary charged particle beam. The area of charged particle beamlets may have at least a first beamlet and a second beamlet. The primary charged particle beam can be generated with a charged particle beam source including a beam emitter. The beam emitter may for instance be a CFE, a Schottky emitter, a TFE or another high current—high brightness charged particle beam source (such as an electron beam source), as e.g. mentioned above. According to some embodiments, the beam emitter may emit one primary charged particle beam, which may be processed (e.g. by being split up by a multi-aperture plate) so that a plurality of primary charged particle beamlets are generated. For instance, the aperture openings in the multi-aperture plate may be arranged into a 1-dimensional beamlet array, or a 2-dimensional beamlet array, such as—for instance—a hexagonal, a rectangular or quadratic beamlet array.

As indicated by block 702, the array of charged particle beamlets is focused on a specimen, for example with an objective lens assembly. The objective lens assembly may be an objective lens array or a common objective lens assembly. For example, an objective lens array may include two or more electrostatic lenses and/or two or more magnetic lenses. A common objective lens assembly may include a magnetic lens component and an electrostatic lens component, particularly an electrostatic lens component operating in a deceleration mode.

As indicated by block 703, aberration differences within the array of primary charged particle beamlets, for example differences in aberrations and/or resolution between the first beamlet and the second beamlet, can be corrected with an aberration correction element. The aberration correction element can correct either Cs, i.e. spherical aberrations, or both Cc and Cs, i.e. chromatic aberrations and spherical aberrations. According to embodiments described herein, the aberration correction element can be a non-rotationally symmetric multipole corrector. For example, a quadrupole-octupole corrector for simultaneous correction of Cs and Cc or a double hexapole corrector for Cs correction can be provided.

According to some embodiments, the aberration correction element may act on the primary charged particle beam or may act on the primary charged particle beamlets. Yet further, additionally or alternatively, for a common objective lens assembly, the aberration correction element may correct off-axial aberrations of the objective lens assembly. For an objective lens array, the beamlets may enter the lenses of the objective lens array along the optical axis. Accordingly, correction of the condenser lens assembly (and optionally further lenses) may be provided by the aberration correction element. According to yet further embodiments, which can be combined with other embodiments described herein, the aberration correction element may act as a collimator lens, wherein a condenser lens assembly may be omitted.

According to some embodiments described herein, the charged particle beam device may include further beam optical elements, such as condenser lenses, (scanning) deflectors, beam benders, correctors, or the like. In some embodiments, a condenser lens may be placed before the multi-aperture plate (i.e. upstream of the primary charged particle beam when seen in a direction of the propagating primary charged particle beam). The charged particle beam device according to embodiments described herein may include a beam blanker, such as an individual beam blanker for each beamlet or a common beam blanker.

According to yet further embodiments, which can be combined with other embodiments described herein, a condenser lens assembly may include one or more condenser lenses. Each of the condenser lenses can be electrostatic, magnetic or combined magnetic electrostatic. According to some embodiments, the multi-aperture plate, i.e. an array of aperture openings may be replaced with a different multi-aperture plate, for example for changing the diameters of the aperture openings. This enables for switching between different beamlet currents. Particularly for exchanging multi-aperture plates, the condenser lens assembly can include two or more condenser lenses for adjusting the focal length. Adjusting the focal length can be advantageous for adjusting the total magnification of the source. As described above, the charged particle beam device as described herein may be used for particle beam inspection or particle beam lithography applications. Further, the methods of imaging a specimen with an array of primary charged particle beamlets can similarly apply to a method of illuminating a specimen with an array of primary charged particle beamlets, for example for particle beamlet lithography applications.

While the foregoing is directed to embodiments, other and further embodiments may be devised without departing from the basic scope thereof, and the scope thereof is determined by the claims that follow.

The invention claimed is:

1. A charged particle beam device for inspection of a specimen with an array of primary charged particle beamlets, comprising:
a charged particle beam source to generate a primary charged particle beam;
a multi-aperture plate having at least two openings to generate an array of primary charged particle beamlets having at least a first beamlet having a first resolution on the specimen and a second beamlet having a second resolution on the specimen;
an aberration correction element, provided between the charged particle beam source and the multi-aperture plate, to correct at least one of spherical aberrations and chromatic aberrations of rotationally symmetric charged particle lenses, and to correct the difference between the first resolution on the specimen and the second resolution on the specimen, the aberration correction element comprising two electric or magnetic quadrupole elements and at least two multipole elements, the at least two multipole elements comprising two combined electric-magnetic quadrupole elements; and
an objective lens assembly for focusing each primary charged particle beamlet of the array of primary charged particle beamlets onto a separate location on the specimen.

2. The charged particle beam device according to claim 1, wherein the aberration correction element further comprises at least three electric or magnetic octupole elements.

3. The charged particle beam device according to claim 1, wherein the at least two multipole elements generate at least two hexapole fields.

4. The charged particle beam device according to claim 1, wherein the at least two multipole elements are two electrostatic quadrupole elements and the aberration correction element further comprises two electrostatic lenses.

5. The charged particle beam device according to claim 4, wherein the aberration correction element further comprises at least three electric octupole elements.

6. The charged particle beam device according to claim 1, wherein the aberration correction element focuses the primary charged particle beam to reduce a divergence between the first beamlet and the second beamlet.

7. The charged particle beam device according to claim 1, further comprising:
a condenser lens assembly provided between the charged particle beam source and the multi-aperture plate.

8. The charged particle beam device according to claim 1, wherein the objective lens assembly comprises an objective lens array to focus each beamlet of the array of primary charged particle beamlets individually.

9. The charged particle beam device according to claim 1, wherein the objective lens assembly comprises a magnetic lens component acting on the array of primary charged particle beamlets.

10. The charged particle beam device according to claim 9, further comprising:
a lens array provided between the multi-aperture plate and the objective lens assembly.

11. The charged particle beam device according to claim 10, further comprising:
at least one of a lens or a deflector array, wherein the lens and the deflector array guides the array of primary charged particle beamlets through a coma free point of the objective lens assembly.

12. A method of imaging or illuminating a specimen with an array of primary charged particle beamlets, comprising:
generating an array of primary charged particle beamlets having at least a first beamlet and a second beamlet by illuminating a multi-aperture plate with a primary charged particle beam;
focusing the array of primary charged particle beamlets on the specimen with an objective lens assembly; and
correcting aberration differences between the first beamlet and the second beamlet with an aberration correction element according to claim 1.

13. The method according to claim 12, wherein the correcting the aberration differences is provided by the aberration correction element acting on the primary charged particle beam.

14. The method according to claim 12, wherein correcting the aberration differences includes correcting off-axial aberrations of the objective lens assembly.

15. The method according to claim 12, wherein the aberration correction element collimates the primary charged particle beam.

16. The method according to claim 12, further comprising:
collimating the primary charged particle beam with a condenser lens assembly.

17. The charged particle beam device of claim 1, wherein the at least two openings of the multi-aperture plate generate the array of primary charged particle beamlets from the primary charged particle beam.

18. A charged particle beam device for inspection of a specimen with an array of primary charged particle beamlets, comprising:
a charged particle beam source to generate a primary charged particle beam;
a multi-aperture plate having at least two openings to generate an array of charged particle beamlets having at least a first beamlet having a first resolution on the specimen and a second beamlet having a second resolution on the specimen;
an aberration correction element, provided between the charged particle beam source and the multi-aperture plate, to correct at least one of spherical aberrations and chromatic aberrations of rotationally symmetric charged particle lenses, and to correct the difference between the first resolution on the specimen and the second resolution on the specimen, wherein the aberration correction element comprises two electrostatic quadrupole elements and two electrostatic lenses; and
an objective lens assembly for focusing each primary charged particle beamlet of the array of primary charged particle beamlets onto a separate location on the specimen.

19. The charged particle beam device of claim 18, wherein the aberration correction element further comprises at least three electric octupole elements.

20. The charged particle beam device of claim 18, wherein the at least two openings of the multi-aperture plate generate the array of primary charged particle beamlets from the primary charged particle beam.

\* \* \* \* \*